United States Patent
Cheng et al.

(10) Patent No.: US 8,298,882 B2
(45) Date of Patent: Oct. 30, 2012

(54) METAL GATE AND HIGH-K DIELECTRIC DEVICES WITH PFET CHANNEL SIGE

(75) Inventors: Kangguo Cheng, Guilderland, NY (US); Bruce B. Doris, Brewster, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 12/563,032

(22) Filed: Sep. 18, 2009

(65) Prior Publication Data

US 2011/0068369 A1    Mar. 24, 2011

(51) Int. Cl.
*H01L 21/00* (2006.01)

(52) U.S. Cl. ........ 438/153; 438/154; 438/199; 257/351; 257/E27.062; 257/E27.108; 257/E21.632

(58) Field of Classification Search .................. 438/153, 438/154, 188, 199, 202, 203, 313, 322; 257/204, 257/274, E27.062–E27.067, E27.108, E21.632
See application file for complete search history.

(56) References Cited

U.S. PATENT DOCUMENTS

| 7,057,216 B2 * | 6/2006 | Ouyang et al. ................. 257/194 |
| 7,223,679 B2 | 5/2007 | Murthy .......................... 438/592 |
| 7,732,344 B1 * | 6/2010 | Tsai et al. ...................... 438/734 |
| 2009/0032849 A1 * | 2/2009 | Higashino ..................... 257/262 |
| 2009/0230463 A1 * | 9/2009 | Carter et al. .................. 257/327 |

* cited by examiner

*Primary Examiner* — Shaun Campbell
(74) *Attorney, Agent, or Firm* — George Sai-Halasz; Louis J. Percello

(57) ABSTRACT

Fabricating of semiconductor devices includes: depositing epitaxially a SiGe layer onto both NFET and PFET portions of a Si surface; blanket disposing a first sequence of layers over the SiGe layer including a high-k dielectric and a metal, incorporating the first sequence of layers into the gatestacks and gate insulators of both NFET devices and PFET devices; the first sequence of layers is selected to yield desired device parameter values for the PFET devices; removing the gatestack, the gate dielectric, and the SiGe layer for the NFET devices, re-forming the NFET devices by deploying a second sequence of layers that include a second high-k dielectric and a second metal; the second sequence of layers is selected to yield desired device parameter values for the NFET devices.

11 Claims, 8 Drawing Sheets

METAL GATE AND HIGH-K DIELECTRIC DEVICES WITH PFET CHANNEL SIGE

BACKGROUND

The present invention relates to electronic devices. In particular, it relates to FET devices with metal gates, high-k dielectrics, and channel SiGe for the PFET devices.

As FET (Field-Effect-Transistor) devices are being scaled down, the technology becomes more complex, and changes in device structures and new fabrication methods are needed to maintain the expected performance improvements from one successive device generation to the next. Performance may be enhanced by independent optimization of device parameters for the PFET and the NFET devices.

BRIEF SUMMARY

A method for fabricating a circuit structure is disclosed. The method includes depositing onto a Si surface a SiGe layer using blanket epitaxial growth. Blanket disposing a first sequence of layers over the SiGe layer, including a high-k dielectric and a metal. Next, incorporating this first sequence of layers into the gatestacks and gate insulators of both the NFET devices and the PFET devices. This first sequence of layers has been selected to yield desired device parameter values for the PFET devices. The method further includes removing the gatestack, the gate dielectric, and the SiGe layer that was underneath the gate dielectric in the NFET devices. Next, re-forming the NFET devices, by deploying a second sequence of layers, which includes a second high-k dielectric and a second metal. The second sequence of layers is selected to yield desired device parameter values for the NFET devices.

A circuit structure is also disclosed. PFET devices have a gate dielectric with a high-k dielectric, a gatestack with a metal, a p-source/drain and silicide layer formed over the p-source/drain. NFET devices also include a gate dielectric with a high-k dielectric, a gatestack with a metal, an n-source/drain and silicide layer formed over the n-source/drain. An epitaxial SiGe is present underneath, and in direct contact with, the PFET gate dielectric, with the silicide layer formed over the p-source/drain, with the silicide layer formed over the n-source/drain, and present underneath, and in direct contact with the sidewall spacers of both the NFET device and the PFET devices. The epitaxial SiGe is absent underneath the NFET gate dielectric. The PFET and NFET device parameters are independently optimized through the composition of their gate dielectrics and gate stacks.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
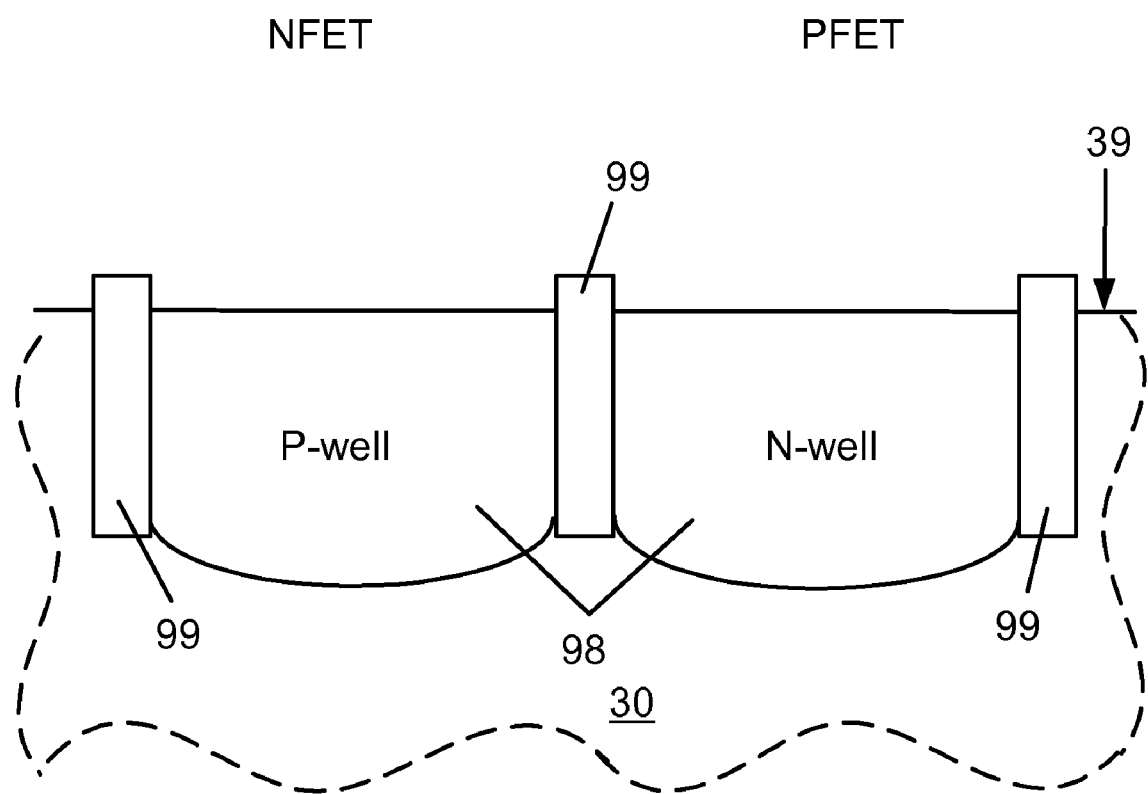
FIG. 1 shows a schematic cross section of an initial stage in an embodiment of the method for fabricating a circuit structure.

It is understood that Field Effect Transistor-s (FET) are well known in the electronic arts. Standard components of a FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator, or gate dielectric. Depending whether the "on state" current in the channel is carried by electrons or by holes, the FET comes ins two kinds: as NFET or PFET. (In different nomenclature the NFET and PFET devices are often referred to as NMOS and PMOS devices.) It is also understood that frequently the NFET and PFET devices are used together in circuits. Such NFET, PFET combination circuits may find application in analogue circuits, or in digital circuits where they are typically coupled into CMOS configurations.

Manufacturing of NFET, PFET, and CMOS is very well established in the art. It is understood that there are large number of steps involved in such processing, and each step may have practically endless variations, known to those skilled in the art. For embodiments of this disclosure it is understood that the whole range of known processing techniques are available for fabricating the devices, and only those process steps will be detailed that are related to the embodiments of the present invention.

The most common material of microelectronics is silicon (Si), or more broadly, Si based materials. Si based materials are various alloys of Si in the same basic technological content as Si. Such Si based materials of significance for microelectronics are, for instance, the alloys of Si with other elements of the IV-th group of the periodic table, such as silicon germanium (SiGe). The devices in the embodiments of the present disclosure are typically part of the art of Si device technology, which as understood that it may include possible applications of SiGe.

In advanced, deeply submicron devices, in the below 50 nm gate length regime, optimizing parameters for both NFET and PFET devices in the same circuit structure is quite desirable. One parameter particularly in need of optimization is the device threshold. High performance small FET devices require precise threshold voltage control. As operating voltages decrease, to below 1 V, threshold voltages also have to decrease, and threshold variation becomes less tolerable. Advanced devices may use high-k gate dielectrics and metal gates. Every element, such as a different gate dielectric, or a different gate material, may influence the threshold voltage.

A process, or material, which may change advantageously the threshold of one type of device, may at the same time adversely affect the threshold of the other type of device. It is desirable in fabricating a circuit structure to have the ability to separately optimize parameters for each type of device.

One technique that was found to be advantageous for the PFET device is to have a SiGe channel region. The SiGe channel in the PFET may help optimizing the threshold, and may lead to better carrier mobility. For the NFET, a SiGe channel is not desired. Embodiments of the present disclosure use SiGe for the PFET device, but avoid it for the NFET device. The SiGe in the embodiments of the present invention is first blanket deposited, and later removed from the NFET channel region.

FIG. 1 shows a schematic cross section of an initial stage in an embodiment of the disclosed method for fabricating a circuit structure. The figure shows a substrate 30 having a Si principal surface 39. The substrate 30 may be any type known in the electronic art, such as bulk Si, or semiconductor on insulator (SOI), fully depleted, or partially depleted, or any other kind without limitation. At the Si principal surface 39, portions are defined for NFET devices and for PFET devices, as shown by the NFET and PFET words in the figure. Often, but not exclusively, such definitions are achieved with isolation structures 99. The figure shows a shallow trench 99 isolation scheme, as this is a typical advanced isolation technique available in the art. Such shallow trenches are capable of defining and separating the NFET and PFET portions of the circuit structure. FIG. 1 shows what typically may only be a small fraction of a whole circuit structure, such as for instance, an electronic chip, as indicated by the wavy dashed line boundaries. Typically, but not exclusively, wells 98 are fabricated in the NFET and PFET portions, with N-well for PFET devices, and P-well for NFET devices.

Figure 2:
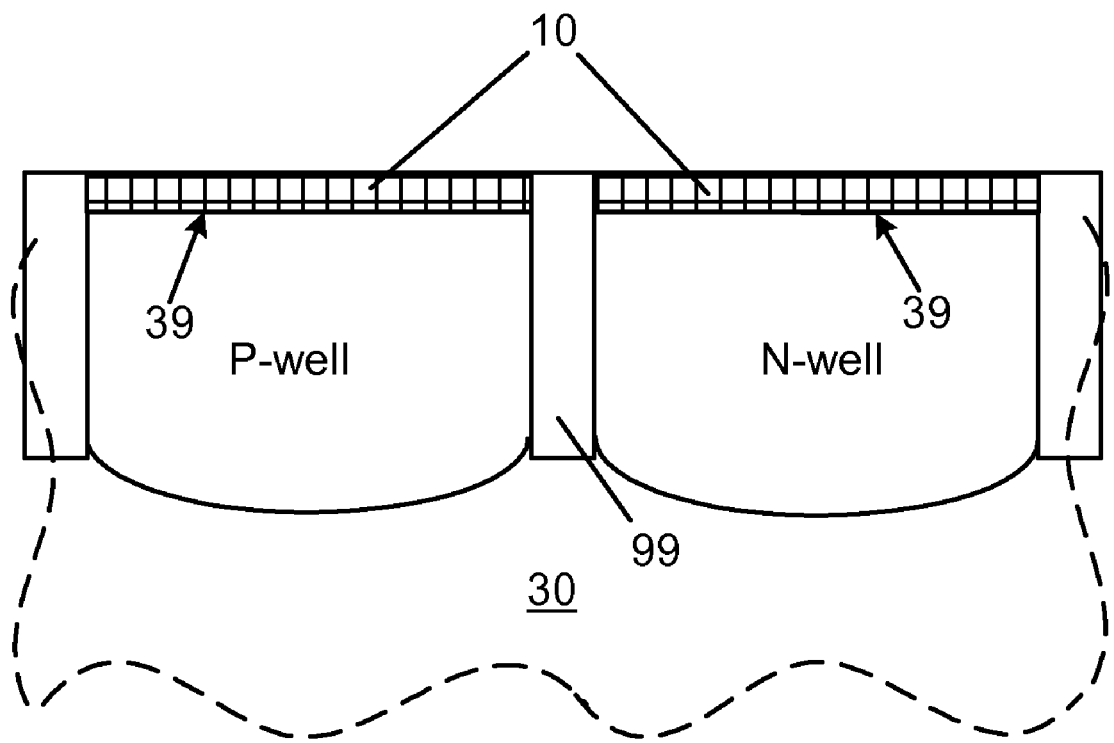
FIG. 2 shows blanket epitaxial growth of SiGe.

FIG. 2 shows completed blanket epitaxial growth of SiGe, a step in the fabrication method. Since all the figures hereafter show the same view of an evolving structure, many elements are repeated from figure to figure. For accentuating the changes presented by each figure, and to avoid cluttering, indicator numbers are frequently omitted for those element that have been described in relation to previous figures. Accordingly, for instance, FIG. 2 does not display indicator numbers for all the shallow trenches or for the wells. These elements are obviously recognizable from FIG. 1.

FIG. 2 shows the state of fabrication after depositing onto the NFET and PFET portions a SiGe 10 layer using blanket epitaxial growth. The term "blanket" means that the deposition is carried out without masking either of the portions. The SiGe 10 is epitaxially grown onto the Si principal surface 39. Accordingly, epitaxial SiGe is overlaying and is in direct contact with the Si principal surface 39. A consequence of the epitaxial deposition, which may possibly be selective, is that SiGe is usually found only over the Si principal surface 39. Other surfaces, for instance, exposed trench 99 surfaces remain void of SiGe. Blanket epitaxial deposition of SiGe onto Si is generally known in the art. In various embodiments of the disclosure the SiGe 10 layer thickness may be between about 1 nm and 30 nm, or more typically between about 10 nm to 20 nm.

In describing a structure, the adjective "epitaxial" is typically used to indicate that a particular material has been epitaxially deposited. The structural consequence of epitaxial deposition is that the deposited material and the host material, at their common interface, have the same symmetry and crystalline orientation. Further terms that may be used, such as "epitaxial relation", "epitaxially", "epitaxy", "epi", "epitaxial growth" etc. carry their customary usage, crystalline continuity across the interface.

Figure 3:
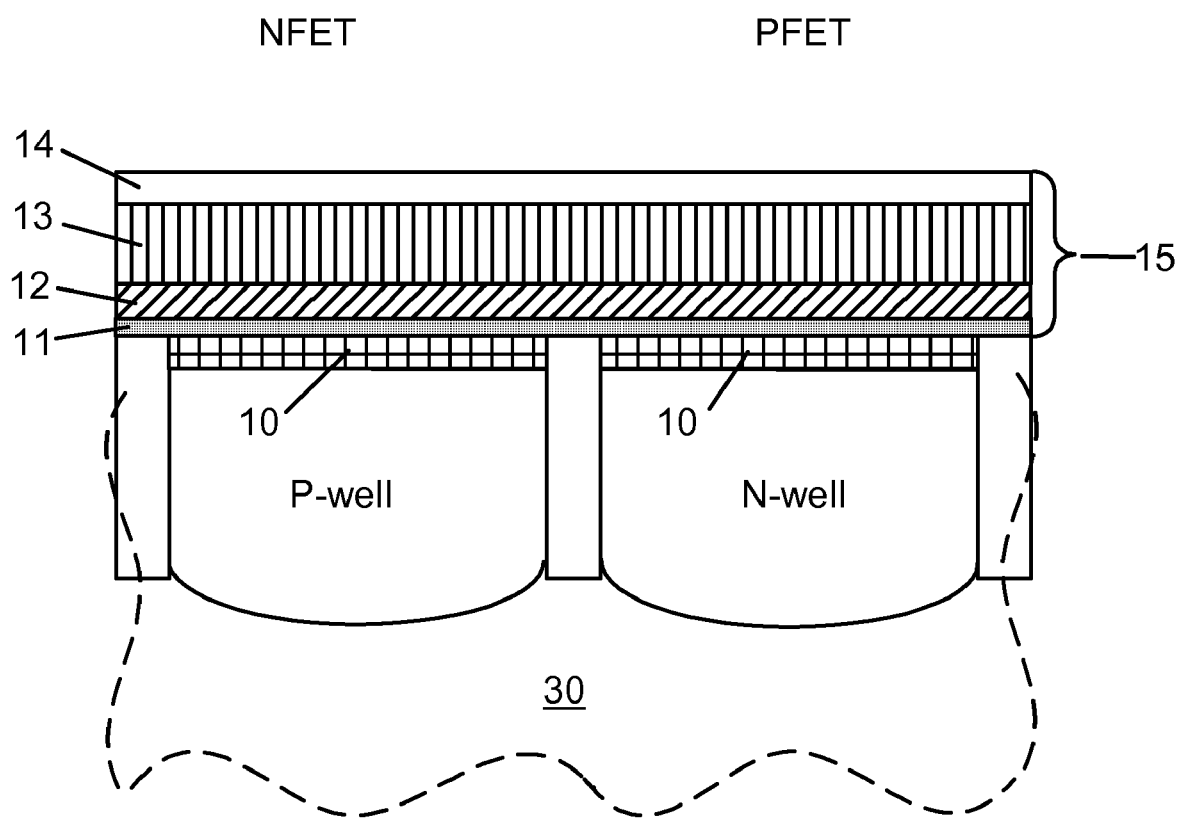
FIG. 3 shows the state of fabrication after disposing a first sequence of layers.

FIG. 3 shows the fabrication after blanket disposing a first sequence of layers 15 that cover the SiGe 10 layer. Techniques for such dispositions are known in the art, for instance, without limiting intent, chemical (CVD) vapor deposition. This first sequence of layers 15, may be composed of a great number of individual layers, depending on particulars of the aims for the device structure, and the chosen tradeoff in accepting process complexity. In representative embodiments of the invention the first sequence of layers 15 has a first high-k dielectric 11 layer, and a first metal 12 layer. The first high-k dielectric 11 layer may cover all exposed surfaces, and it is the nearest layer to the SiGe 10. The first high-k dielectric 11 layer is often in direct contact with the SiGe 10, but not necessarily so. In some embodiments, for instance, a thin oxide layer may be present between the SiGe 10 and the first high-k dielectric 11 layer. The first metal 12 layer is over the first high-k dielectric 11 layer, and they may be in direct contact.

The representation of the first sequence of layers 15 in FIG. 3 shows two additional layers. A polysilicon 13 layer and a protective cover 14 layer, typically SiN. These two are shown because they are part of typical embodiment of the invention. But, as stated earlier, apart of the first high-k dielectric 11 layer and the first metal 12 layer in the displayed order, the first sequence of layers 15 may contain more, or fewer layers, than displayed in FIG. 3.

For representative embodiments of the invention, the SiGe 10 and the choices regarding the materials and thicknesses of the various layers in the first sequence of layers 15, all serve the purpose of yielding desired device parameter values for the PFET devices. The parameter for which such an optimization may be of most interest is the device threshold. The composition of the SiGe 10, the materials of the first high-k dielectric 11 and the first metal 12, their thicknesses, as well as their interplay with potential additional threshold tuning layers, may be selected with the purpose to yield a desire threshold for the PMOS device. The exact value of the desired threshold may vary, possibly between 0.1V to −0.4V (minus 0.4V), and more typically between −0.1 V and −0.3V. The precise value of the desired PFET threshold may depend on the particular function that the fabricated circuit structure is supposed fulfill. It may also depend on further device characteristics, such as gate length, power supply voltage, and others. Many of these are interdependent themselves. Further device parameters of the PFET devices that may be in consideration for realizing desired values are, without intent of limitation, hole mobility, gate capacitance, fringing capacitances, PFET power consumption, and others.

Based on the above considerations it is clear that different conditions may require different optimization selections. In many representative embodiments of the invention, however, the first high-k dielectric 11 may be selected to be $HfO_2$, and the first metal 12 to be the metallic compound of TiN. Other potential choices may be HfSiO, HfSiON, $ZrO_2$, and more for the first high-k dielectric 11, and TaN, Al, W, HfN and more for the first metal 12. The composition of the SiGe 10 layer may be between 10% to 40% Ge, or more typically between 15% to 30% Ge.

Figure 4:
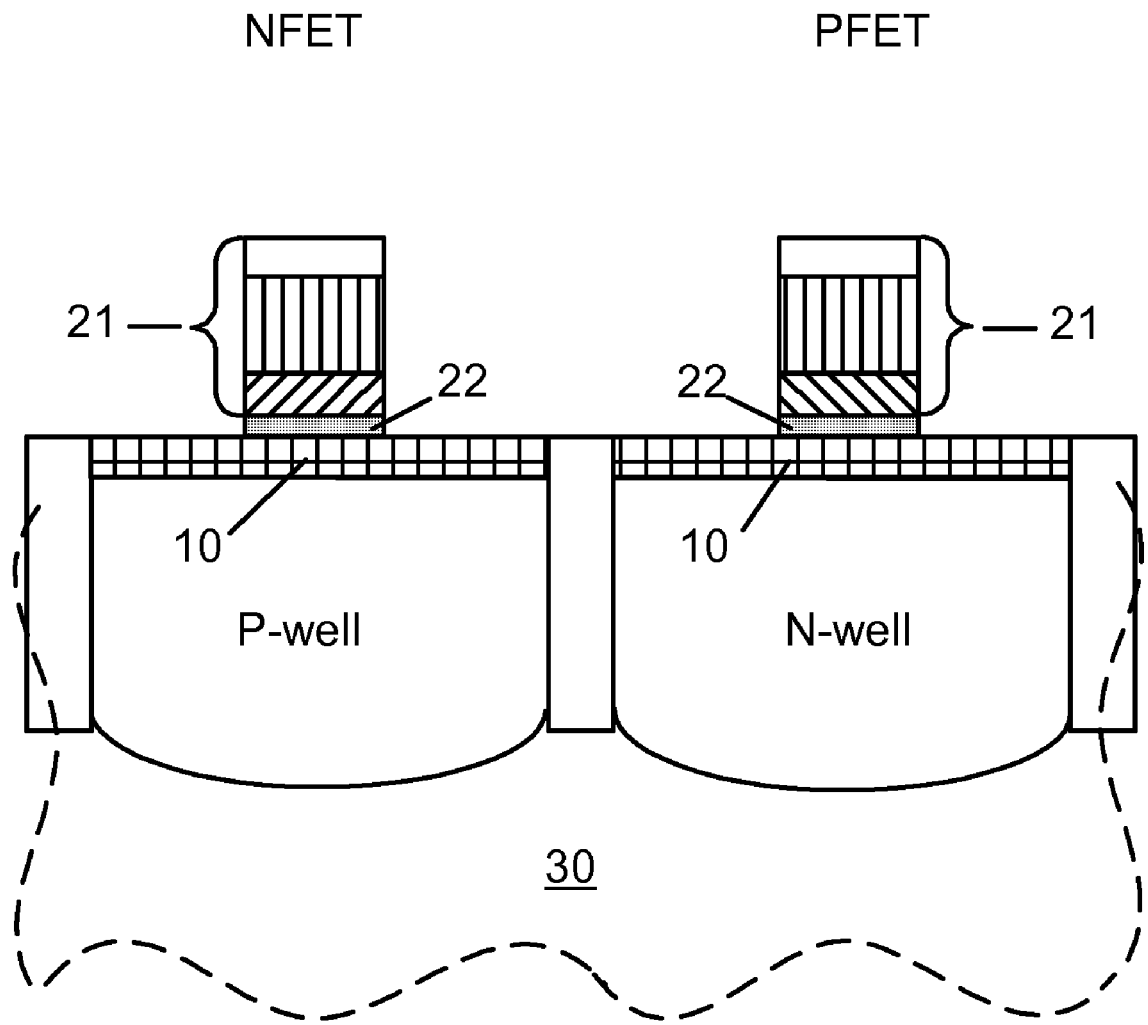
FIG. 4 shows the incorporation of the first sequence of layers into both PFET and NFET devices.

FIG. 4 shows the incorporation of the first sequence of layers 15 into both PFET and NFET devices. The device fabrication may proceed in manners known in the art between the state of the circuit structure shown in FIG. 3 and FIG. 4. The first sequence of layers 15 has been patterned, and now it plays identical roles for the PFET and NFET devices. The first high-k dielectric 11 layer became included, or may have become the whole of, the first gate dielectrics, namely the gate dielectric 22 for both type of devices. The first metal 12 layer is found in first gatestacks, namely the gatestack 21, of both type of devices. In typical embodiments of the invention for both NFET and PFET devices the gatestack 21 lengths may be between about 5 nm to 50 nm. The SiGe 10 layer remained in place during the gate definitions and patterning.

Figure 5:
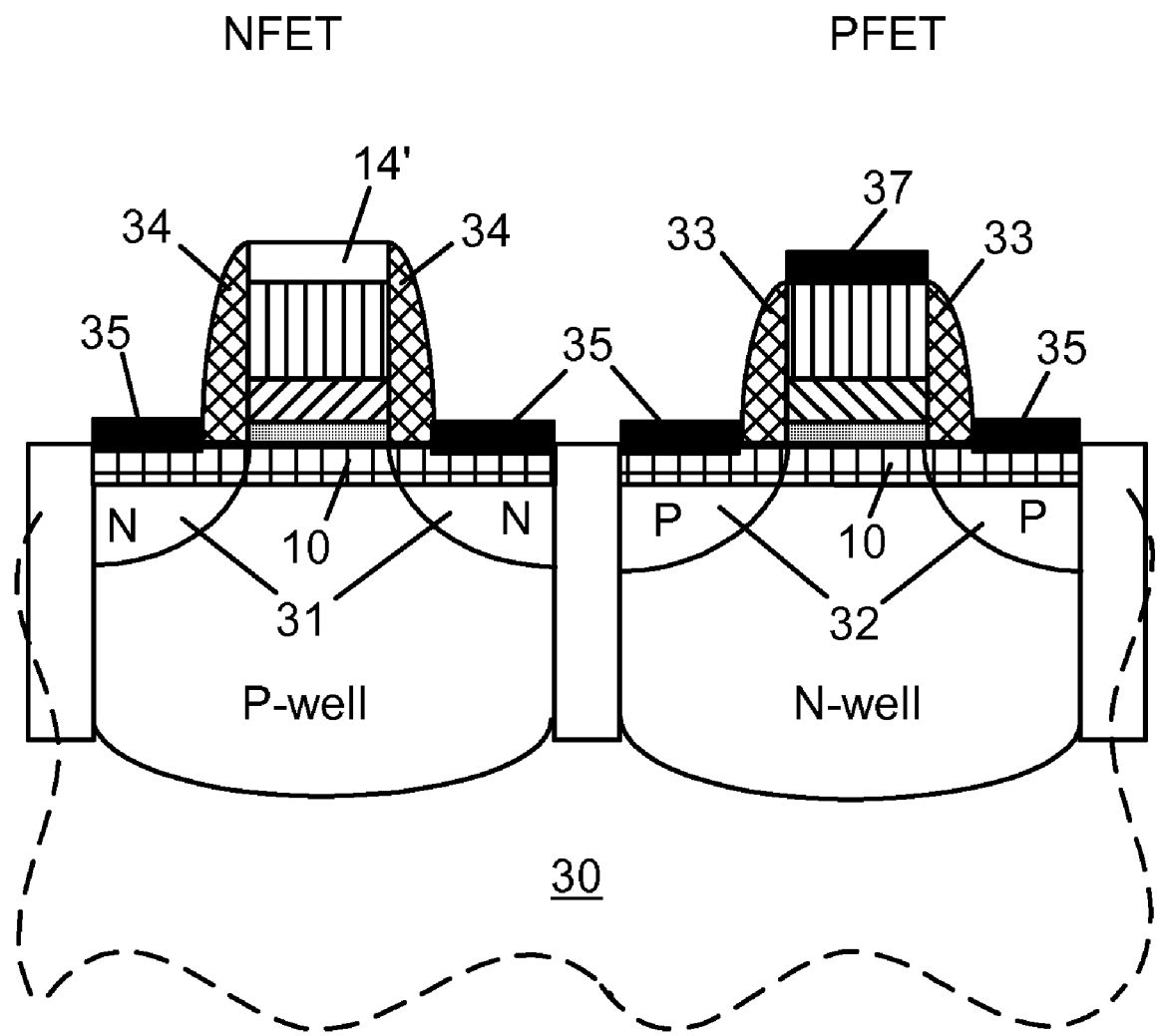
FIG. 5 shows further processing, including silicide deposition.

FIG. 5 shows further processing, including silicide deposition. The device fabrication may proceed in manners known in the art between the state of the circuit structure shown in FIG. 4 and FIG. 5. Both the NFET source/drain 31 and the PFET source/drain 32 has been fabricated. The source/drain for both type of device are shown symbolically, since as known in the art, these elements themselves may be complex structures. The NFET spacers 34 and PFET spacers 33 have also been fabricated.

FIG. 5 also shows that silicide formation has taken place. The source/drain for both type of devices has been silicided 35, typically in a single processing step. Although one may refer to as first and second silicide layers pertaining to differing type of devices, these silicides are essentially the same on all sources/drains, consequently using a common indicator number is descriptive of their properties. These so called junction silicides 35 are contacting the SiGe 10 layer in both type of devices. This is advantageous because it lowers the contact resistance for the device electrodes. In advanced small devices electrode contact resistance has become a concern. It is known, that having SiGe under the silicide is a way of lowering contact resistance. Since in the embodiments of the present invention the SiGe 10 layer is blanket deposited, it is not only in the PFET device, but also in the NFET device. Earlier uses of SiGe for the PFET channel were carried out by SiGe epitaxy for the PFET portion, and in contrast with embodiments of the present invention, the advantage of lowering contact resistance for the NFET devices was passed over. There are many silicides known in the electronic arts. A typical silicide that may be used for the embodiments of this disclosure is NiSi.

FIG. 5 shows that the PFET gatestack has also been silicided 37. Prior to silicidation, a protective cap layer 14', typically SiN, patterned from the protective cover layer 14 of the first sequence of layers 15, has been left in place for the NFET devices, while the same layer has been removed from the PFET devices. Consequently, in the same step that the source/drain silicide 35 is formed, the PFET device gatestack may also become silicided 37. Although, the silicide 37 over the PFET gatestack is optional for embodiments of the present invention, it has several useful purposes. Such a silicide layer 37 lowers resistance, and protects the underlying layers during further processing.

Figure 6:
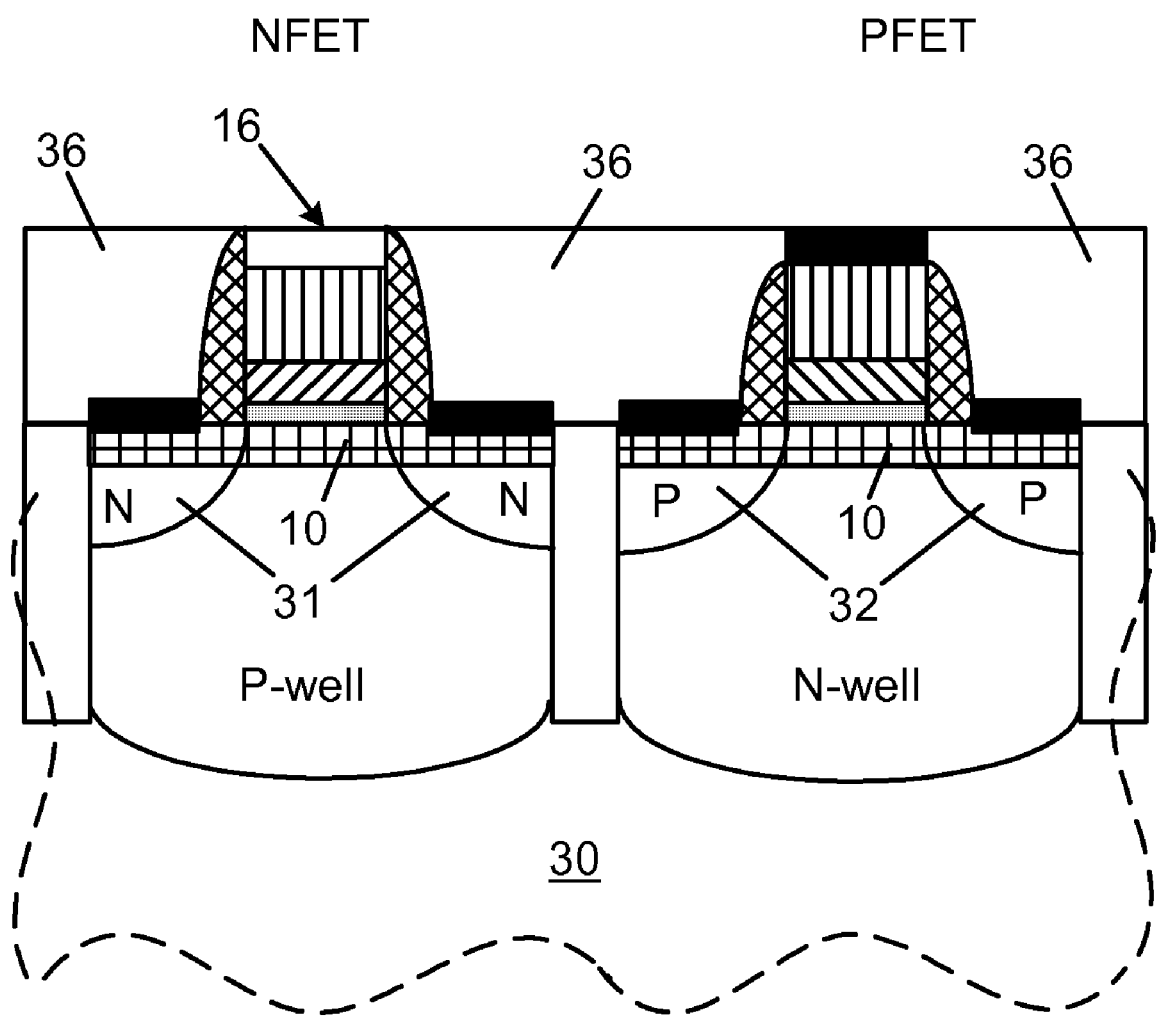
FIG. 6 shows deposition and planarization of a supportive layer.

FIG. 6 shows deposition and planarization of a supportive layer 36. In device fabrication, after completing the gate structures one often applies a so called inter-layer dielectric (ILD) layer. In embodiments of the present invention the role of such a layer is mainly for protection, primarily of the silicide 35 over the junctions. The supportive layer 36 prevents the deposition of unwanted layers during further processing over the silicided junctions and other parts of the circuit structure. Such deposited layers would be difficult to remove later. The supportive layer 36 may be of a low dielectric oxide material, and may stay permanently in the circuit structure. But, one may use alternatives, for instance, the supportive layer 36 may be a photoresist, or another self planarizing film like an anti reflective coating material, or a spin on dielectric. These alternatives during subsequent processing may be removed. In all cases, the supportive layer 36 may be planarized, typically by the known means of chemical/mechanical polishing (CMP). With such planarization, the supportive layer 36 may be in level with the top plane 16 of the first gatestack of the NFET devices.

Figure 7:
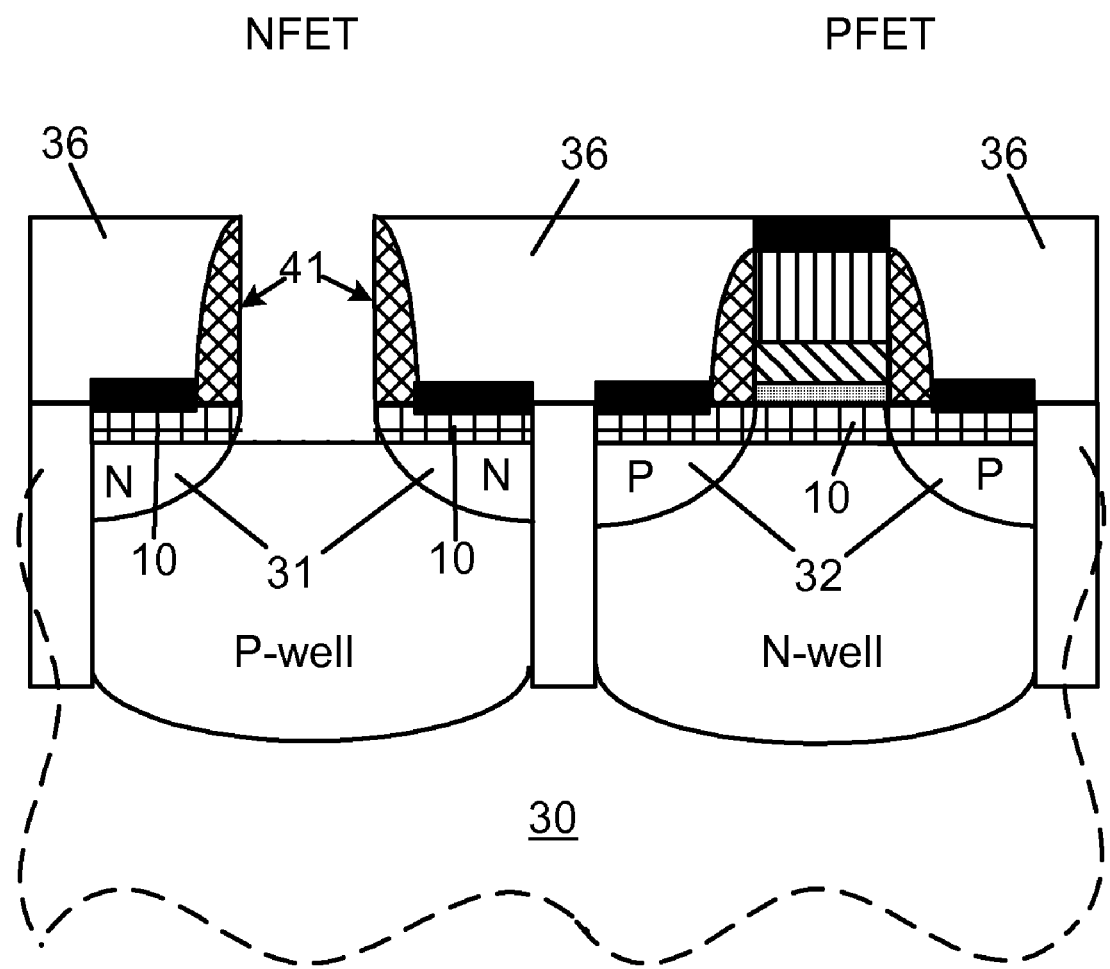
FIG. 7 shows the stage in an embodiment of the method where parts of the NFET device, including the SiGe layer, have been removed.

FIG. 7 shows the stage in an embodiment of the method where parts of the NFET device, including the SiGe layer, have been removed. With the supportive layer 36 in place, one may safely remove the materials of the earlier deposited first sequence of layers 15 from the NFET device. The PFET gatestack top layer may be silicided 37, which would protect the PFET gatestack during the NFET gatestack removal. These removals follow known etching methods in the art.

Next, again in a known manner, the SiGe 10 is removed from underneath the gate location of the NFET device. The SiGe 10 and the composition of the first sequence of layers 15 were optimized from the PFET's point of view. With such elements in place the NFET parameters, such as the threshold, may have been far from optimal, and this removal allows modifications for the NFET devices. Having now a void in the place of the NFET gatestack, one has also exposed the inside surfaces 41 of the NFET spacers 34. These inside surfaces 41 face each other and are substantially perpendicular to the Si principal surface 39.

Figure 8:
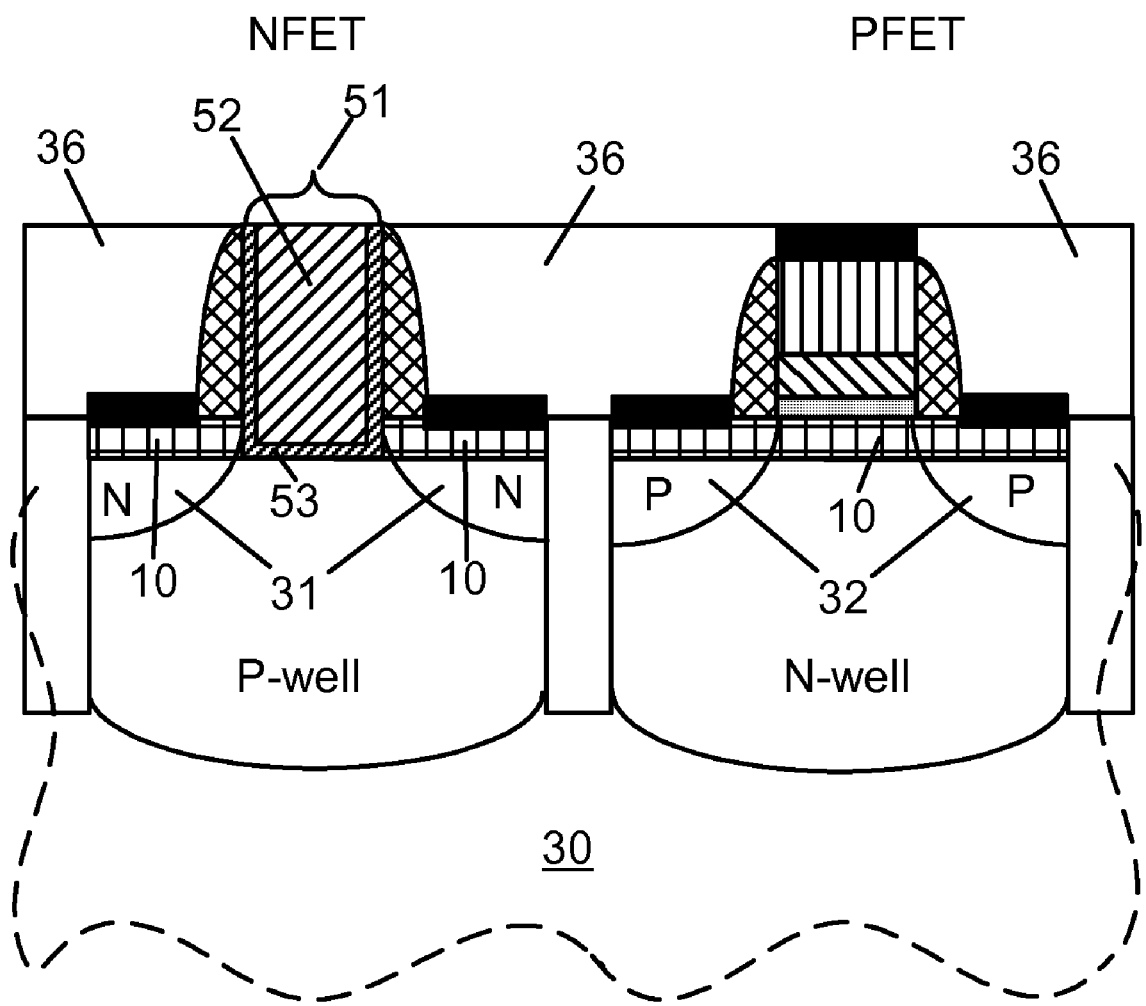
FIG. 8 shows a circuit structure in an embodiment of the disclosure, with the NFET device re-formed.

FIG. 8 shows the circuit structure in an embodiment of the disclosure, with the NFET device re-formed. One may deploy a second sequence of layers 51 that include a second high-k dielectric 53 and a second metal 52. As earlier with the first sequence of layers, the deposited second sequence of layers is forming, or re-forming, the NFET device with a second gate dielectric and a second gatestack. The second sequence of layers may contain further layers beyond the second high-k dielectric 53 and the second metal 52. The materials in the second sequence of layers is selected to yield desired device parameter values for the NFET devices. Also, not having the SiGe 10 in the channel of the NFET device allows for a desirable threshold value, and for a better electron carrier mobility. The exact value of the desired threshold for the NFET device may vary, typically between −0.1V (minus 0.1V) to 0.4V and more typically between 0.1V and 0.3V. The precise value of the desired NFET threshold may depend on the particular function that the fabricated circuit structure is supposed fulfill. It may also depend on further device characteristics, such as gate length, power supply voltage, and others. Many of these are interdependent themselves. Further device parameters of the NFET devices that may be in consideration for realizing desired values are, without intent of limitation, electron mobility, gate capacitance, fringing capacitances, NFET power consumption, and others.

In representative embodiments of the invention the second high-k dielectric 53 may be selected from the same materials the first high-k dielectric 11, and the second metal 52 may be NFET materials know in the art, such as La (lanthanum), LaO, HfN, and others.

The layers re-forming the NFET device, including the second high-k dielectric 53 and the second metal 52, may typically be blanket deposited by known methods. After such depositions the circuit structure may again be subjected to CMP, which removes the unwanted materials from the earlier planarized surfaces.

It is clear from the described embodiments of the processing methods, and as it is depicted in FIG. 8, the epitaxial SiGe 10 is overlaying and is in direct contact with the Si principal surface 39. Furthermore, the epitaxial SiGe 10 is present underneath, and in direct contact with the PFET gate dielectric 22, with the first and second silicide layers 35 formed over the p-source/drain 32 and the n-source/drain 31. Also, in representative embodiments the epitaxial SiGe 10 is present underneath, and in direct contact with the sidewall spacers 33, 34 of both the PFET device and the NFET device. However, the SiGe 10 is absent underneath the high-k gate dielectric 53 of the NFET device. Furthermore, the processing as carried out for re-forming the NFET device leaves its mark in that the second high-k dielectric 53 is fully covering the NFET's sidewall spacers inside surfaces 41.

In representative embodiments of the invention the foregoing described circuit structure is characterized as being a CMOS structure.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "top", "side," "over", "underneath" etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before" or "after", does not imply or necessitate a fixed order of step sequence.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A method for fabricating a circuit structure, comprising:
    defining portions for NFET devices and for PFET devices on a Si principal surface of a substrate;
    depositing onto said portions a SiGe layer using blanket epitaxial growth;
    blanket disposing a first sequence of layers over said SiGe layer, wherein said first sequence of layers has one layer in direct contact with said SiGe layer and said one layer in direct contact with said SiGe layer is of a dielectric material, wherein said first sequence of layers comprise a first high-k dielectric and a first metal;
    incorporating said first sequence of layers into both said NFET devices and said PFET devices, wherein said first high-k dielectric is being included into first gate dielectrics and said first metal is being included into first gatestacks;
    for said NFET devices but not for said PFET devices, removing said first gatestack, said first gate dielectric, and removing said SiGe layer from regions that were directly thereunder said first gate dielectrics; and
    deploying a second sequence of layers comprising a second high-k dielectric and a second metal, wherein for said NFET devices forming a second gate dielectric and a second gatestack.

2. The method of claim 1, further comprising:
forming a silicide which contacts said SiGe layer over source/drain regions of both said NFET devices and said PFET devices.

3. The method of claim 2, further comprising:
in said PFET devices, forming said silicide on top of said first gatestack concurrently with said silicide forming over said source/drain regions.

4. The method of claim 1, further comprising:
prior of removing said first gatestack in said NFET devices, forming an inter-layer-dielectric (ILD) which is blanket disposed and planarized to be level with a top plane of said first gatestack in said NFET devices.

5. The method of claim 4, further comprising:
selecting said ILD to be an oxide.

6. The method of claim 1, further comprising:
in said first sequence of layers, selecting said first high-k dielectric to comprise $HfO_2$, and said first metal to comprise TiN.

7. The method of claim 1, further comprising:
carrying out said deploying of said second sequence of layers by blanket disposing said second sequence of layers over said portions, and polishing to remove said second sequence of layers outside of said second gatestack in said NFET devices.

8. The method of claim 7, further comprising:
in said second sequence of layers, selecting said second high-k dielectric to comprise $HfO_2$, and said second metal to comprise lanthanum (La).

9. The method of claim 1, further comprising:
selecting said first sequence of layers to yield desired device parameter values for said PFET devices, and selecting said second sequence of layers to yield desired device parameter values for said NFET devices.

10. The method of claim 9, further comprising:
selecting threshold voltage values as said desired device parameter values for both said NFET and said PFET devices.

11. The method of claim 1, further comprising:
selecting said circuit structure to be a CMOS circuit.

* * * * *